United States Patent
Ota

(10) Patent No.: US 7,224,736 B2
(45) Date of Patent: May 29, 2007

(54) ADAPTIVE CLOCKING MECHANISM FOR DIGITAL VIDEO DECODER

(75) Inventor: Takaaki Ota, San Diego, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 726 days.

(21) Appl. No.: 10/656,031

(22) Filed: Sep. 5, 2003

(65) Prior Publication Data

US 2004/0047593 A1    Mar. 11, 2004

Related U.S. Application Data

(63) Continuation of application No. 09/415,965, filed on Oct. 12, 1999, now Pat. No. 6,661,846.

(60) Provisional application No. 60/104,250, filed on Oct. 14, 1998.

(51) Int. Cl.
*H04N 7/12* (2006.01)
*H03L 7/00* (2006.01)

(52) U.S. Cl. .................. 375/240.28; 348/537

(58) Field of Classification Search .......... 375/240.28, 375/240.02, 240.01, 240.25; 348/443, 448, 348/537; 370/503; 345/14, 698
See application file for complete search history.

(56) References Cited

U.S. PATENT DOCUMENTS

| 4,683,469 | A | * | 7/1987 | Elsmore et al. | ............... 345/14 |
| 6,028,641 | A | * | 2/2000 | Kim | .......................... 348/537 |
| 6,177,922 | B1 | * | 1/2001 | Schiefer et al. | ............. 345/698 |
| 6,661,846 | B1 | * | 12/2003 | Ota | ....................... 375/240.28 |

* cited by examiner

*Primary Examiner*—Gims Philippe
(74) *Attorney, Agent, or Firm*—John L. Rogitz

(57) ABSTRACT

An adaptive clocking mechanism is provided for a digital display system. The digital display system includes a clock recovery system, for recovering a system time clock from a video bit-stream generated at an encoder, and a decoding system for decoding and decompressing the video bit-stream at a frame rate. The adaptive clocking mechanism operates to determine, from video format information transmitted from the encoder, the occurrence of a frame rate at which a transmitted signal is encoded that differs from a frame rate expected by the decoder. Upon such a determination, the adaptive clocking mechanism further operates to select a modifier from a group of modifiers based on format information derived from the video bit stream, including the encoded frame rate. The selected modifier is then applied to a synchronization function of the decoder in a manner to bring the decoder operation into synchronization with the non-expected encoder frame rate.

23 Claims, 3 Drawing Sheets

ADAPTIVE CLOCKING MECHANISM FOR DIGITAL VIDEO DECODER

RELATED APPLICATIONS

This application is a continuation of U.S. patent application Ser. No. 09/415,965, filed Oct. 12, 1999 now U.S. Pat. No. 6,661,846 for an invention entitled "ADAPTIVE CLOCKING MECHANISM FOR DIGITAL VIDEO RECORDER", which claims priority from U.S. provisional application Ser. No. 60/104,250, filed Oct. 14, 1998, priority to both of which is claimed.

FIELD OF THE INVENTION

The invention relates generally to video decoders. More specifically, the invention relates to modifying the clock mechanism of a digital video decoder to allow for synchronization of decoded and encoded standard definition (SD) and high definition (HD) video signals that may have multiple formats and/or frame rates.

BACKGROUND OF THE INVENTION

With ever increasing demand for video throughput and a relatively finite transmission infrastructure, compression of video signal information to be transmitted has become essential. Fortunately, the coincident vast increase in digital processing capability has rendered practical the digitization of such video signal information followed by application of various compression algorithms to the digitized data. In the operation of that compression process, the digitized video signal information is operated on by an encoder at the transmission site, which carries out the desired compression algorithms and produces as an output a video bitstream requiring substantially less transmission bandwidth that would have been required for the original video signal information. After transmission of that compressed video bitstream to a receiving site, that bitstream is operated on by a decoder which reverses the compression process and restores the original video signal information.

A widely-accepted standard for the encoding and transport of such digitized video signal information is the MPEG-2 Standard, the derails of which are set forth in the International Organisation for Standardisazion's International Standard Document ISO/IEC 13818-1, *Information Technology—Generic Coding of Moving Pictures and Associated Audio Information: Systems* (November 1994), which Standard Document is incorporated by reference herein. The discussion herein is based on the application MPEG-2 encoded video signals and MPEG-2 compliant decoders, but it should be understood that the invention described herein is nor limited to a particular encoding/decoding method or standard.

Digital video decoders such as found in digital television receivers or in set-top boxes (STB), require accurate synchronization between the encoding rate of the incoming video signals—i.e., the rate at which an input video bit-stream is encoded by at a transmission site, and the decoding rate of such signals—i.e., the rate at which the input video bit-stream is decoded by the digital video decoder receiving the encoded video bitstream, Because the received data is expected to be processed at a particular rate—to march the rate at which it is generated and transmitted, a loss of synchronization between the decoder and die encoder leads to either buffer overflow or underflow at the decoder, and as a consequence, loss of presentation and/or display synchronization.

Generally, synchronization in such video decoders occurs in a two-stage process. In the first stage, a digital video decoder analyzes the incoming video bit stream transmitted by the encoder to determine the clock frequency, or base clock, of the encoder. A standard method of clock-recovery at the decoder with respect to MPEG-2 digital video signals is described below in the Detailed Description. In the second stage of synchronization, the decoder uses the recovered base clock rate of the encoder to reproduce video frames at exactly the same rate as that of the transmitter's encoder. This decoder processing includes an extraction of fields from the video bitstream containing decoding and presentation time stamps as well as various video format attributes. For an MPEG-2 compressed video signal, such attributes include the number of pixels per line, the number of lines per frame, and the number of frames per second. These attributes, and thus the respective video formats, differ for standard definition (SD) video and high definition (HD) video.

In particular, it is noted that the "normal" frame rates for the HD and SD video formats are respectively 30 Hz and 29.94 Hz. Note also that 29.94 Hz is the frame rate for the analog NTSC video system and that the SD video format supports corresponding pixels/line and lines/frame rates to those of the NTSC system. Thus, the 29.94 Hz frame rate may be viewed as being somewhat of an artifact from the analog NTSC video system.

A synchronization issue for the decoder is, however, presented by these different frame rates because the MPEG-2 standard permits the application of either frame race to either the HD or SD video format—reflecting both an expectation that some NTSC-produced program material will be transmitted using the HD video format, and the possibility that, in the long run, the SD video format may utilize primarily the 30 Hz frame rate. However, for the indefinite period during which both HD and SD formatted programing is transmitted at both the 30 Hz and the 29.94 Hz frame rates, a necessity exists for the decoder to adapt to die "non-standard" frame rate for a video bitstream in which it occurs. For example, a decoder processing an HD bitstream which was encoded and transmitted using the 29.94 Hz frame rate will experience input buffer underflow and loss of presentation and/or display synchronization unless such an adaptation is made from the expected 30 Hz frame race for that format. In the alternate case of processing an SD bitstream encoded and transmitted at a 30 Hz frame rate, input buffer overflow would be experienced, along with similar loss of presentation and/or display synchronization.

SUMMARY OF THE INVENTION

Accordingly, it is an object of the invention to provide a mechanism to achieve decoder synchronism in the circumstance of the encoded frame rate being ocher than the frame rate expectation of the decoder for the video format being processed. To that end, a method of employing an adaptive clocking mechanism to modify the frame rate of a decoding system of a digital display system is disclosed which includes the following steps. In one step, format information, including the encoded frame race, is derived from a video bit-scream received by the digital display device. In another step, a modifier is selected based on the format information derived from the video bit-stream. Finally, the frame rate is modified by applying the selected modifier to a member of the group consisting of a system rime clock and a system clock frequency.

DETAILED DESCRIPTION OF A PREFERRED EMBODIMENT

Exemplary embodiments of rue timing synchronization mechanism of the invention will now be described in detail with reference to the accompanying drawings. It will be appreciated by one skilled in the art that the inventive concepts disclosed and discussed in detail with reference to the exemplary embodiments herein can be employed to synchronize the frame rate of a digital video decoder which is either integrated within a digital display device—e.g., an integrated digital television receiver/decoder, or which is in a device which is in communication with (although not necessarily physically connected to) a display device—e.g., a digital set-top box (STB). It will also be understood that the inventive concepts herein are intended to apply to environments where, for example, either or both the clock recovery process and the bitstream decoding process may occur within the digital display device itself (e.g., within an integrated digital television receiver/decoder), or in a digital STB or other similar digital decoding device. For simplicity of illustration, the inventive Concepts herein are discussed with reference to a digital video decoding device that includes both the system clock recovery mechanism and decoding mechanism.

For the clock-recovery step of the two step decoder synchronization process described in the Background section, an established method of recovering the base clock with respect to MPEG-2 video signals and systems is set forth in Annex D of the ISO/IEC 13818-1 standard (specifically, Section D.0.3 *System Time Clock Recovery in the Decoder*). It will be understood that, although this is currently the accepted standard method for decoder timing synchronization with the base clock of MPEG-2 signals (such as used in the transmission of digital television in the U.S.), reference to this method is merely for illustrative purposes, and the subject invention is not limited to such method or to digital television systems.

Figure 1:
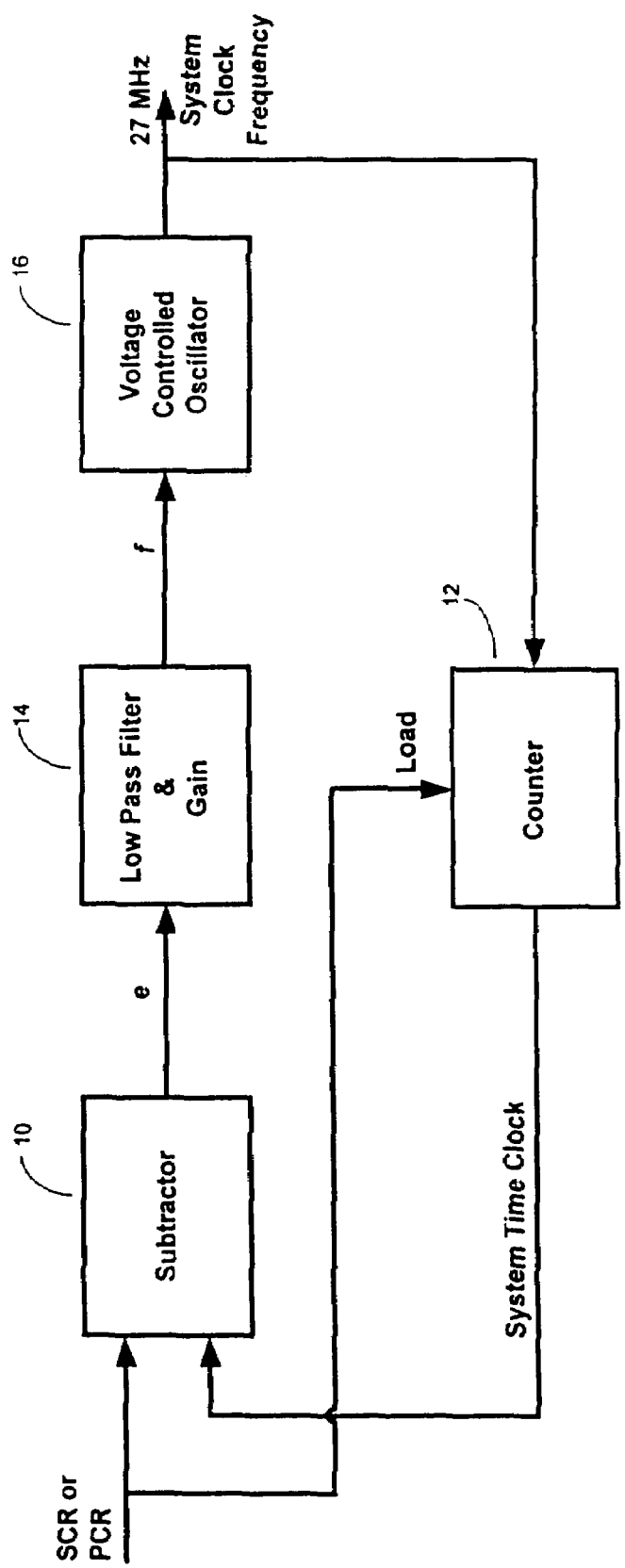
FIG. 1 is a block diagram of a known clock recovery system in a digital video decoder.

The operation of the ISO/IEC 13818-1 standard clock recovery system is depicted schematically in FIG. 1. As will be seen from the figure, either the system clock reference (SCR) or the program clock reference (PCR) is used as a reference signal for the clock recovery system. As is known, the SCR is a time stamp referenced to the encoder clock which recurs in packets of an MPEG-2 program stream at intervals up to 700 ms. The PCR is a corresponding time stamp that recurs in packets of an MPEG-2 transport stream at intervals up to 100 ms. The transport stream is an alternate MPEG-2 bitstream construct which generally provides increased error detection capability relative to the program stream. The SCR and PCR are generally considered to be equivalent time references and, although the discussion following will, for convenience of nomenclature, be based on use of the SCR time stamp, it should be understood that an equivalent clock recovery process would be carried out in the case of the PCR time stamp being provided to the decoder.

With further reference to FIG. 1, an SCR time stamp is received at the decoder and provided as an input to Subtractor 10. At the same time, the SCR input signal is provided as a Load signal to Counter 12, causing the current value of Counter 12, representing the current frequency of the decoder System Time Clock (STC), to be output therefrom and provided as a second input to Subtractor 10. A difference is determined by Subtractor 10 between the input SCR value and the current STC value, and an error signal, e, corresponding to that difference is output from Subtractor 10. After amplification and filtering of that error signal by Low-Pass Filter & Gain 14, the output thereof, $f$, is provided as input to Voltage-Controlled Oscillator 16. The output of the Voltage-Controlled Oscillator 16 is provided to other decoder stages as the current value of the decoder STC and is also fed back to the input of the clock recovery circuit via Counter 12. Thus, as a new SCR time stamp value arrives at the input to Subtractor 10, a new error signal will be generated based on the difference between that new SCR value and the then-current STC value from Counter 12, which error signal is ultimately translated into a new STC value by Voltage-Controlled Oscillator 16, thereby maintaining the decoder STC in synchronism with the encoder clock, as represented by the currently received SCR value. (As is well-known, the standard system clock frequency under the ISO/IEC 13818-1 (MPEG-2) standard is 27 MHz; however, it will be understood that the principle and operation of clock recovery as described herein is independent of such specific frequency and any other frequency may also be used).

In the second stage of synchronization, the decoder uses the recovered base clock rate of the encoder along with decoding and presentation time stamps extracted from fields of the video bitstream to reproduce video frames at exactly the same rate as that of the transmitter's encoder. Various video format attributes are also extracted from fields of the video bitstream which provide essential input data to the synchronization process. For an MPEG-2 compressed video signal, such attributes include the number of pixels per line, the number of lines per frame, and the number of frames per second. And as already noted, these attributes differ as between MPEG-2 video formats, particularly as between standard definition (SD) video and high definition (HD) video, as discussed below.

The MPEG-2 encoding standard contemplates the encoding and transmission of both high definition (HD) video signals and standard definition (SD) video signals. While MPEG-2 permits multiple video formats for both HD and SD, only a single HD encoding format and a single SD format will be discussed herein—the two formats so discussed representing a preponderance of presently-realized applications of MPEG-2 encoding. As will be apparent to those skilled in the art, however, the principles discussed will be equally applicable to others of the permitted MPEG-2 video formats.

The video formats for MPEG-2 are characterized by a horizontal scanning rate, expressed as a number of pixels per line, a vertical scanning rate, expressed as a number of lines per frame, and a frame rate, expressed as a number of frames per second. A specific HD video format which can be implemented under MPEG-2 is characterized by a horizontal scanning rate of 2200 pixels per line, a vertical scanning rate of 1125 lines per frame, and a frame rate of 30 frames per second, hereafter denoted 30 Hz. [Note that this format is also covered by the Society of Motion Picture and Television Engineers Standard 240M-*Television—Signal Parameters— 1125-Line High-Definition Production Systems* (hereafter SMPTE 240M)] This scanning format, which also constitutes one of the defined picture formats in the Advanced Television Systems Committee Digital Television Standard (hereafter ATSC Standard), can accommodate 1920 active pixels per line and 1080 active lines per frame, in accordance with the ATSC Standard (and, as well, the SMPTE Standard 274M *Television—1920×1080 Scanning and Interface* (hereafter SMPTE 274M)).

The SD video format used herein is characterized by a horizontal scanning rate of 858 pixels per line, a vertical scanning rate of 525 lines per frame, and a frame rate of 29.97 frames per second, hereafter denoted 29.97 Hz. This scanning format also constitutes one of the defined picture formats in the ATSC Standard (and is also defined in the standard: ITU-R BT.601-4, *Encoding parameters of digital television for studios*), and can accommodate 720 active pixels per line and 480 active lines per frame.

It is noted that, although 30 Hz is the "normal" frame rate for the MPEG-2 HD and 29.97 Hz is the "normal" frame rate for MPEG-2 SD, the MPEG-2 standard permits either frame rate to be used with either video format. Note also that the 29.97 Hz frame rate is commonly denoted in the art as "30/1.001," and that convention will generally be used herein.

As is well known, the conversion of an analog video signal to a digital bit stream is carried out by sampling the analog signal at a sampling rate at least twice the signal frequency. In the usual case where the sampling rate is selected such that each digital bit corresponds to one pixel of video information, that sampling rate corresponds to the total number of pixels processed in a unit of time. Thus, using the video format parameters described above, that sampling rate, which is also characterized as the pixel clock, will be the product of the horizontal scanning rate, the vertical scanning rate and the frame rate. In the case of the HD video format, this pixel clock would be derived as:

30 Hz×1125×2200=74.25 MHz.

Similarly, the pixel clock for the SD video format would be derived as:

30/1.001 Hz×525×858=13.5 MHz.

In the operation of the video decoder, these sampling/scanning frequencies—i.e. the pixel clock rate, the horizontal scanning rate and the frame rate, must be derived from the decoder STC. For example, considering the case of the HD video format, extraction of the video format attributes from an MPEG-2 video bit-stream begins with the derivation of the pixel clock, which is typically derived by multiplying the recovered 27 MHz base clock by 11 and then dividing by 4. Thus, the pixel clock rate for this format is derived as: 27 MHz×11/4=74.25 MHz. The horizontal scanning rate for each frame is then derived by dividing the pixel clock by the total number of pixels per line, which is a constant for a given video format. Thus a divider is implemented in the decoder having as its dividend the pixel clock rate (here, 74.25 MHz) and as its divisor the pixels per line for the video format being decoded (here, 2200). The output of the divider, representing the derived horizontal scanning rate, will be: 74.25 MHz/2200=33.75 KHz. The frame rate can then be generated in a second divider by dividing the horizontal frequency by the total number of scanning lines per frame. For this exemplary HD video format, the decoder frame rate will be derived as 33.75 KHz÷1125 lines/frame=30 Hz.

Correspondingly for the SD video format case, the pixel clock for the SD video is derived by dividing by 2, the 27 MHz system clock recovered in the first synchronization stage, to obtain a 13.5 MHz pixel clock. The horizontal scanning frequency can then be derived by dividing this pixel clock by the total number of pixels per line. For the exemplary SD format described here, the 3.5 MHz pixel clock will be divided by 858 pixels per line to obtain a horizontal scanning frequency of 15.734 KHz. The frame rate is then derived by dividing this horizontal scanning frequency by the total number of scanning lines per frame, here the ATSC standard of 525, to arrive at the current standard frame rate for SD of 29.97 Hz (30/1.001).

Although as set forth above, the standard decoder operations for SD and HD video are arranged to develop frame rates of 30/1.001 and 30 respectively, the ATSC standard allows for transmission frame rates of 30 and 30/1.001 for all standard formats. Thus, despite the fact that digital video decoders normally decode an HD video signal at a frame rate of 30 frames/second, such signal can instead be transmitted at a 30/1.001 frames/second rate. Similarly, while a decoder normally decodes an SD video signal at a frame rate of 30/1.001 frames/second, the ATSC standard allows for transmission of such SD signal at 30 frames per second rate. In such case, the SD and HD signals decoded and reproduced by the decoder will not be synchronized with the signals transmitted by the encoder. It will be appreciated that without such synchronization, significant errors in the reconstruction of the digital video signal can occur. For example, it is known that each digital display device decoder has a bitstream buffer at its input, which is filled for some period of time before the first picture is removed for decoding. If the decoder rate is faster than the encoder rate, less than the entire bitstream is decoded from the bitstream buffer by the digital display device. This is referred to as bitstream buffer underflow. Conversely, if the decoder rate is slower than the encoder rate, then bitstream buffer overflow occurs. Bitstream buffer underflow is likely to cause the resulting picture to freeze while an overflow will result in data loss and could have disastrous results.

The need to ensure that a digital video decoder is capable of synchronizing incoming SD and HD signals encoded and transmitted at a frame rate different from the decoders normal expectation (based on the video format being processed) is addressed by Applicant's invention through alternate embodiments. In the first embodiment, a clock frequency modification means is incorporated into the decoder function to act on the output of the clock recovery system—i.e., the STC. Since the decoder-derived pixel clock rate, horizontal scanning rate and frame rate are each linear functions of the STC frequency, a modification of the STC frequency proportional to the desired modification of those functions (i.e., the modification needed to provide synchronization at the non-standard frame rate) will ultimately be translated into corrected values for those functions.

Figure 2:
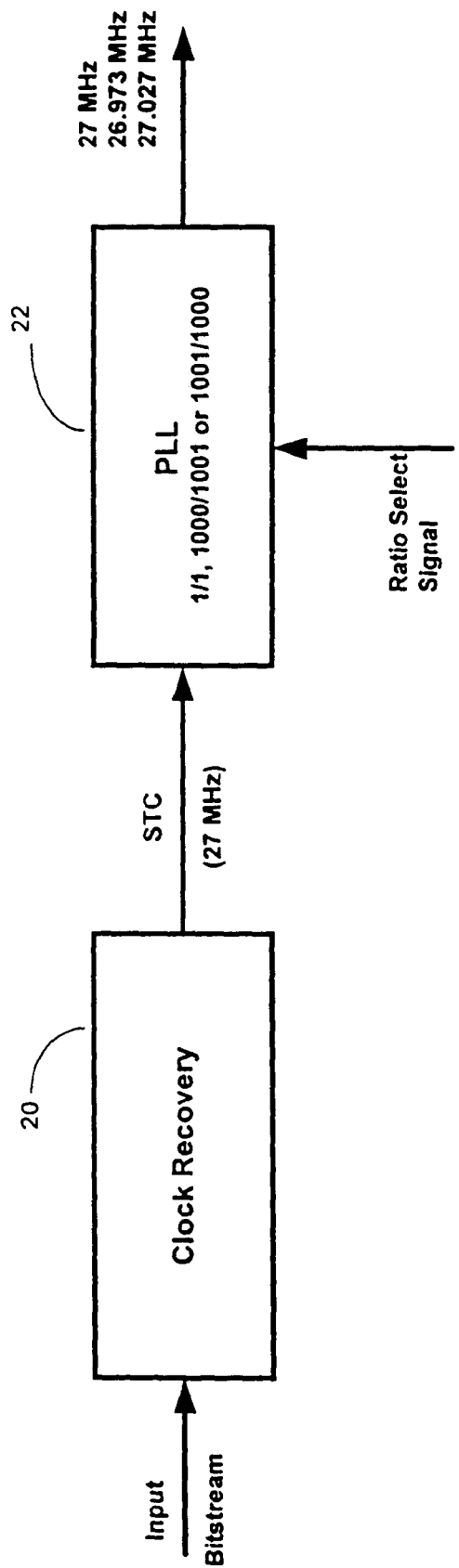
FIG. 2 is a block diagram showing an embodiment of the adaptive clocking mechanism of the invention.

The frequency modification means of this embodiment is schematically illustrated in FIG. 2. As will be seen from the figure, the output of the decoder clock recovery system 20, representing the decoder STC at a nominal 27 MHz frequency, is applied as an input to the frequency modification means 22, which in the illustrated embodiment is constituted as a phase locked loop (PLL). The PLL operates to apply one of three ratios as a multiplier for the input STC, and to thereby produce as an output of the frequency modification means a modified STC as the product of the applied ratio and the input STC. Those ratios correspond to various states of the encoded frame rate (as derived from fields of the input bitstream to the decoder) relative to the decoder's frame-rate expectation for the video format being decoded. Specifically, a first ratio (1/1) corresponds to an identity between the encoded frame rate and the decoder frame-rate expectation; a second ratio (1000/1001) corresponds to an encoded frame rate of 30/1001 Hz and a decoder frame-rate expectation of 30 Hz, and the third ratio (1001/1000) corresponds to an encoded frame rate of 30 Hz and a decoder frame-rate expectation of 30/1,001 Hz. These ratios and the corresponding frame-rate relationships are set forth in tabular form in Table 1.

TABLE 1

| Encoded Frame Rate | Decoder Frame-Rate Expectation | Ratio Factor |
|---|---|---|
| 29.97 | 29.97 | 1.000 |
| 29.97 | 30.00 | .999 (1000/1001) |
| 30.00 | 29.97 | 1.001 (1001/1000) |
| 30.00 | 30.00 | 1.000 |

Software, which may be run by the decoder's main processor or by a separate processor associated with the PLL, is implemented to detect the encoded frame rate in the input bitstream fields and to compare that encoded frame rate with the decoder frame-rate expectation for the video format being transmitted. After comparing the encoded frame rate with the decoder frame-rate expectation, the software selects the appropriate PLL ratio (as illustrated in the table above) and directs the PLL to apply that ratio to the inputted STC. The output of the PLL will thus be either the STC frequency of 27 MHz, or the modified clock frequencies of 26.973 MHz or 27.027 MHz.

By use of a clock frequency modification arrangement according to the invention, the video decoder's frame rate can be successfully synchronized with the frame rate of the encoder for both SD and HD signals, irrespective of the frame rate selected at the encoder. This may be further understood with reference to the following table wherein the first two rows apply to an HD signal and the latter two rows to an SD signal

TABLE 2

| RATIO FACTOR | BASE CLOCK (MHz) | PIXEL CLOCK (MHz) | PIXELS/ LINE | LINES/ FRAME | FRAME RATE (Hz) |
|---|---|---|---|---|---|
| 1.000 | 27.000 | 74.2500 | 2200 | 1125 | 30.00 |
| 1000/1001 | 26.973 | 74.1758 | 2200 | 1125 | 29.97 |
| 1.000 | 27.000 | 13.5000 | 858 | 525 | 29.97 |
| 1001/1000 | 27.027 | 13.5135 | 858 | 525 | 30.00 |

Thus it can be seen, for example, that where an SD signal is encoded with a frame rate of 30 Hz, a modifying factor of 1001/1000 (or 1.001) can be applied to the base clock frequency to arrive at a modified base clock frequency of 27.027 MHz. This modified signal will then be provided to the decoder synchronization-rate derivation functions. In this case the modified pixel clock will then be 13.5135 MHz (27.027/2). Dividing this number by the total number of pixels per line (858) and the total number of scanning lines per frame (525) will result in a decoded frame rate of 30 kHz.

Figure 3:
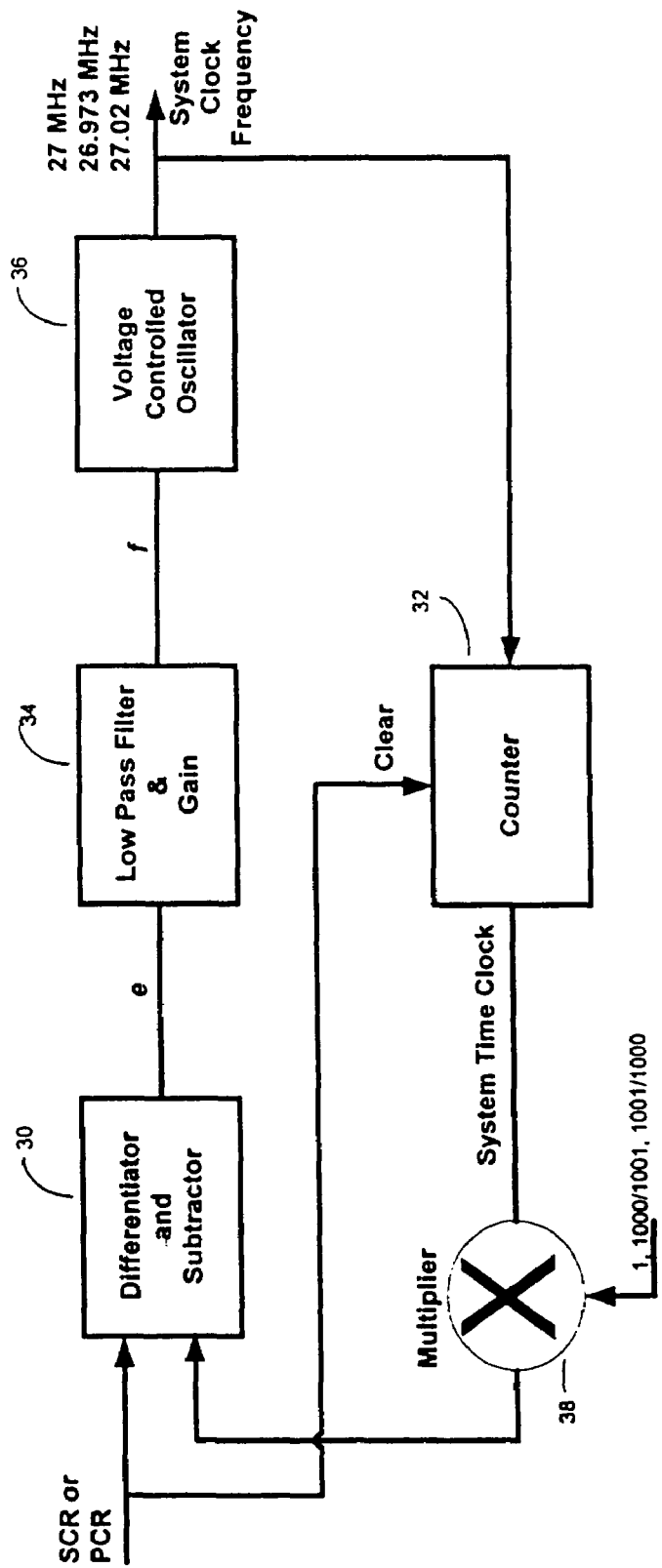
FIG. 3 is a block diagram showing another embodiment of the adaptive clocking mechanism of the invention.

In an alternative embodiment of the invention, a clock frequency modification arrangement to provide the necessary modification to the STC rate for decoder synchronization (as in the prior embodiment) is realized through an adaptation of the decoder clock-recovery system itself. With this embodiment, a modified STC frequency is produced at the output of the clock recovery system which can be used to derive correct synchronization values in the case of a non-standard encoder frame rate. The methodology of this embodiment will be better understood by reference to FIG. 3, which depicts a clock recovery system substantially corresponding to that of FIG. 1 with the addition of a Multiplier unit 38 inserted to receive the System Time Clock output from Counter 32, and providing an output thereof to Differentiator and Subtractor 30, which replaces Subtractor 10 of the standard clock-recovery system of FIG. 1. In the operation of this embodiment, the SCR signal is provided to a Differentiator and Subtractor device 31 and, as well, to Counter 32 as a Clear signal. [As with the discussion of FIG. 1 above, because of the substantial equivalence between the PCR and SCR time stamps, the discussion here is framed in terms of only the SCR; it should be understood however, that this embodiment will operate equally well with the PCR reference.] The Counter 32 is cleared after it receives each SCR or PCR, and thus, the value of the Counter 32 is the number of clock ticks between the arrival of two SCR's or two PCR's. An output of the Counter 32 is then fed into the input of Multiplier 38, the output of which is, in turn, provided as an input to Differentiator and Subtractor 30. The Differentiator evaluates the difference between a received SCR value and the immediately preceding SCR value, as well as the difference between the Counter output and the Counter value corresponding to that immediately preceding SCR value. The Subtractor determines a difference between the Differentiator SCR and Counter differences and provides this difference output to Low-Pass Filter 34. The output of the Low-Pass Filter 34 is then provided to a Voltage-Controlled Oscillator (VCO) 36, which is preferably a voltage-controlled crystal oscillator. The modified system clock frequency is then output from VCO 36, where it is provided as an output to other decoder functions, including synchronization-rate derivation functions, such as are depicted in FIG. 2 of the contemporaneously filed and cross-referenced application Ser. No. 09/415,965, and is also fed back to Counter 32.

In the operation of Multiplier 38, the System Time Clock output of Counter 32 will constitute the multiplicand, and the multiplier will be selected from one of three ratios corresponding to various states of the encoded frame rate relative to the decoder's frame-rate expectation for the video format being decoded. Specifically, a first ratio (1/) corresponds to an identity between the encoded frame rate and the decoder frame-rate expectation; a second ratio (1001/1000) corresponds to an encoded frame rate of 30/1001 Hz and a decoder frame-rate expectation of 30 Hz; and the third ratio (1000/1001) corresponds to an encoded frame rate of 30 Hz and a decoder frame-rate expectation of 30/1001 Hz.

Software, which may be run by the decoder's main processor or by a separate processor associated with the Multiplier, is implemented to detect the encoded frame rate in the input bitstream fields and to compare that encoded frame rate with the decoder frame-rate expectation for the video format being transmitted. Based on tat information, the software selects the appropriate Multiplier ratio and causes the Multiplier to apply that ratio to the multiplicand input. The development of appropriate software to carry out these functions will be well within the skill of those in the art.

In the operation of the method of this embodiment, upon setting the Multiplier 38 input to 1.000, the modified system clock frequency output from the VXO 36 is a nominal 27 MHz. In a similar manner, when the Multiplier 38 input is set to 1000/1001, the modified system clock frequency is 27.027 MHz, and when it is set to 1001/1000, the modified system clock frequency is 26.973 MHz.

While details of the invention are discussed herein with reference to particular examples to which the principles of the present invention can be applied, the applicability of the invention to other devices and equivalent components thereof will become readily apparent to those of skill in the art.

Accordingly, it is intended that all such alternatives, modifications, permutations, and variations to the exemplary embodiments can be made without departing from the scope and spirit of the present invention.

I claim:

1. In a digital display device including a clock recovery system for recovering a system time clock reference from a video bit-stream generated at an encoder to produce a decoder system clock frequency, and a decoding system for decoding and decompressing the video bitstream at a frame rate, an adaptive clocking mechanism for said decoding system comprising: means for extracting from said video bit stream attributes of a video format transmitted via said bitstream; selecting means, cooperatively linked with said decoding system, for selecting a modifier from a group of modifiers based on video format attributes derived from said video bit-stream; and modifying means, cooperatively linked with said selecting means and said decoding system, for modifying a synchronization timing parameter of said decoding system with said selected modifier prior to decoding said video bit-stream, wherein the group of modifiers includes the ratios 1/1, 1000/1001, and 1001/1000.

2. The adaptive clocking mechanism of claim 1, wherein said modifying means comprises means for applying said selected modifier to a system clack frequency provided by said clock recovery system.

3. The adaptive clocking mechanism of claim 1, wherein said selecting means comprises a software routine, said group of modifiers consists of ratios of frame rates selectable at said encoder, said synchronization timing parameter includes a frame rate applied by said decoder, and wherein said modifying means modifies said decoder frame rate by applying said selected modifier to said system clock frequency.

4. The adaptive clocking mechanism of claim 3, wherein said modifying means comprises phase-locked loop circuitry.

5. The adaptive clocking mechanism of claim 1, wherein said synchronization timing parameter is a frame rate applied by said decoder, and said modifying means modifies said frame rate by applying said modifier selected by said selecting means to said system time clock.

6. The adaptive clocking mechanism of claim 1, wherein said selecting means comprises a software routine, said group of modifiers consists of ratios of frame rates selectable at said encoder, said synchronization timing parameter includes a frame rate applied by said decoder, and wherein said modifying means modifies said decoder frame rate by applying said selected modifier to said system time clock.

7. The adaptive clocking mechanism of claim 6, wherein said dock recovery system is modified to include a multiplier having as a first input a system time clock signal and as a second input signal a selected one of said frame-rate ratios, and an output, representing a product of said first and said second inputs, which is provided as an input to a differentiator/subtractor having as a second input a clock reference signal derived from said video bitstream, wherein an output of said clock recovery system is modified in proportion to said selected one of said frame-rate ratios inputted two said multiplier.

8. A method for providing synchronization of a video decoder for an input video bitstream encoded in respect to a given video format, where said given video format is characterized by a preferred frame rate or by an alternate frame rate, aid method comprising the steps of: operating on said input video bitstream to derive therefrom one or more attributes of said given video format, said attributes having a known relationship to said given video format, detecting from said derived attributes an identity of said given video format and an indication of whether said encoded input video bitstream is characterized by said preferred frame rate or said alternate frame rate; where said encoded input video bitstream is characterized by said alternate frame rate, selecting a modifier for application to a synchronization timing function of said decoder, said modifier being related to a differential between said preferred frame rate and said alternate frame rate; and applying said modifier to said decoder synchronization function, wherein the modifier is a preferred to alternate frame rate ratio of 1000/1001.

9. The video decoder synchronization method of claim 8 wherein said attributes of said given video format include an encoded pixel rate, line rare and fume rate for said input video bitstream.

10. The video decoder synchronization method of claim 9 wherein each said given video format is characterized by a unique combination of the mid encoded pixel race, line rate and frame rate.

11. The video decoder synchronization method of claim 8 wherein said synchronization function is a system time clock for said decoder and said step of applying said modifier operates to effect an adjustment in a rate of said system time clock.

12. The video decoder synchronization method of claim 1 wherein said modifier is proportional to a ratio of values of said preferred frame rate and of said alternate frame rate.

13. The video decoder synchronization method of claim 8 wherein said synchronization function is a clock recovery function of said decoder and said step of applying said modifier operates to effect an adjustment in an output rate of said clock recovery function.

14. The video decoder synchronization method of claim 13 wherein said application of said modifier to said clock recovery function includes a multiplication function integral to the said clock recovery function having as a multiplier input said selected modifier.

15. The video decoder synchronization method of claim 14 wherein said modifier is proportional to a ratio of values of said preferred frame rate and of said alternate frame rate.

16. The video decoder synchronization method of claim 8 wherein values of said preferred frame rate and of said alternate frame rate are related according to a known ratio.

17. A method for providing synchronization of a video decoder for an input video bitstream encoded in respect to a given video format, where said given video format is characterized by a referred frame rate or by an alternate frame rate, said method comprising the steps of: operation on said input video bitstream to derive therefrom one or more attributes of said given, video format, said attributes having a known relationship to said given video format; detecting from said derived attributes an identity of said given video format and an indication of whether said encoded input video bitstream is characterized by said inferred frame rate or said alternate frame rate; where said encoded input video bitstream is characterized by said alternate frame rate, selecting a modifier for application to a synchronization timing function of said decoder, said modifier being related to a differential between said preferred frame rate and said alternate frame rate; and applying said modifier to said decoder synchronization function, wherein the modifier is a inferred to alternate frame rate ratio of 1001/1000.

18. The video decoder synchronization method of claim 11, wherein said modifier is proportional to said known ratio.

19. A frame rate modifier for a digital display device comprising: means for selecting a modifier based on format information values from a video bitstream received by the digital display device, said format information values including a system time clock reference value; and, means for modifying at least one of said format information values, by applying said selected modifier, in order to adjust a frame rate at which input information is operated on by a decoding device associated with said digital display device, wherein the modifier is selected from a group consisting of ratios of frame rates including the ratios 1/1, 1000/1001, and 1001/1000.

20. The frame rate modifier of claim 19 wherein a system clock frequency is produced from said system time clock reference value, wherein said means for selecting comprises means for selecting said modifier from a group consisting of ratios of frame rates selectable at an encoder transmitting said bitstream, and said means for modifying comprises means for applying said modifier to said system clock frequency.

21. The frame rare modifier of claim 20, wherein said means for modifying is further defined by phase-locked loop circuitry.

22. The frame rate modifier of claim 19, wherein said means for modifying comprises means for modifying said system time clock.

23. The frame rate modifier of claim 22, wherein said means for modifying comprises a multiplier.

* * * * *